US011211224B2

(12) United States Patent
Okai et al.

(10) Patent No.: US 11,211,224 B2
(45) Date of Patent: Dec. 28, 2021

(54) CHARGED PARTICLE BEAM APPARATUS

(71) Applicant: HITACHI HIGH-TECH CORPORATION, Tokyo (JP)

(72) Inventors: Nobuhiro Okai, Tokyo (JP); Daisuke Bizen, Tokyo (JP); Tomoyasu Shojo, Tokyo (JP); Naomasa Suzuki, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/049,353

(22) PCT Filed: Apr. 26, 2018

(86) PCT No.: PCT/JP2018/016980
§ 371 (c)(1),
(2) Date: Oct. 21, 2020

(87) PCT Pub. No.: WO2019/207707
PCT Pub. Date: Oct. 31, 2019

(65) Prior Publication Data
US 2021/0249221 A1 Aug. 12, 2021

(51) Int. Cl.
H01J 37/244 (2006.01)
H01J 37/147 (2006.01)
(Continued)

(52) U.S. Cl.
CPC ............ H01J 37/244 (2013.01); H01J 37/12 (2013.01); H01J 37/1474 (2013.01);
(Continued)

(58) Field of Classification Search
CPC .......... H01J 37/244; H01J 37/28; H01J 37/26; H01J 37/12; H01J 37/1474; H01J 37/02;
(Continued)

(56) References Cited

U.S. PATENT DOCUMENTS 5,517,028 A * 5/1996 Ito ......................... G01R 31/307
250/305
7,714,287 B1 * 5/2010 James ..................... H01J 37/28
250/310
(Continued)

FOREIGN PATENT DOCUMENTS

JP 2005-345272 A 12/2005
JP 2008-027737 A 2/2008
(Continued)

OTHER PUBLICATIONS

International Search Report, PCT/JP2018/016980, 4 pgs.

Primary Examiner — Jason L McCormack
(74) Attorney, Agent, or Firm — Volpe Koenig

(57) ABSTRACT

To improve detection efficiency of secondary particles without increasing a size of a charged particle beam apparatus, a charged particle beam apparatus according to the invention includes: a charged particle beam source configured to irradiate a sample with a primary particle beam; a scanning deflector configured to scan and deflect the primary particle beam to a desired position of the sample; and a detector configured to detect secondary particles emitted from the desired position. The charged particle beam apparatus further includes: a focusing lens electrode arranged coaxially with the primary particle beam and configured to generate a focusing electric field that is an electric field that focuses a trajectory of the secondary particles; and a mesh electrode configured to reduce leakage of the focusing electric field on a trajectory of the primary particle beam.

12 Claims, 12 Drawing Sheets

(51) Int. Cl.
  *H01J 37/28* (2006.01)
  *H01J 37/12* (2006.01)
(52) U.S. Cl.
  CPC ....... *H01J 37/28* (2013.01); *H01J 2237/2448* (2013.01); *H01J 2237/281* (2013.01)
(58) Field of Classification Search
  CPC .......... H01J 37/04; H01J 37/147; H01J 37/21; H01J 2237/281; H01J 2237/2448
  USPC ............... 250/306, 307, 310, 311, 396 R
  See application file for complete search history.

(56) References Cited

U.S. PATENT DOCUMENTS

| | | |
|---|---|---|
| 2008/0017797 A1 | 1/2008 | Cheng et al. |
| 2011/0139983 A1 | 6/2011 | Doi |
| 2014/0124666 A1* | 5/2014 | Sasaki ................. H01J 37/26 250/310 |
| 2014/0306110 A1 | 10/2014 | Schubert |
| 2017/0186583 A1 | 6/2017 | Shirahata et al. |
| 2017/0316915 A1 | 11/2017 | Okai et al. |
| 2017/0345613 A1 | 11/2017 | Mizuhara et al. |

FOREIGN PATENT DOCUMENTS

| | | |
|---|---|---|
| JP | 2012-230919 A | 11/2012 |
| JP | 2014-209482 A | 11/2014 |
| JP | 2015-207458 A | 11/2015 |
| JP | 2017-199606 A | 11/2017 |
| WO | 2016/092642 A1 | 6/2016 |

\* cited by examiner

CHARGED PARTICLE BEAM APPARATUS

TECHNICAL FIELD

The present invention relates to a charged particle beam apparatus, and particularly to a technique for improving detection efficiency of charged particles emitted from a sample.

BACKGROUND ART

A charged particle beam apparatus is an apparatus that irradiates a sample with a charged particle beam such as an electron beam and detects charged particles emitted from the sample, thereby forming an image for observing the sample. The charged particle beam emitted on the sample is referred to as a primary particle beam, and the charged particle emitted from the sample is referred to as a secondary particle. In a manufacturing process of 3D-NAND, which is one of semiconductor devices having a three-dimensional stacked structure, it is important to observe the bottom of a hole or a trench having a high aspect ratio, and it is desirable to improve detection efficiency of secondary particles emitted from the bottom by observation with a charged particle beam apparatus. PTL 1 discloses that, in order to mitigate a reduction in detection efficiency due to fluctuation in a trajectory of secondary particles due to charging, after the secondary particles are deflected off an axis of a primary particle beam, a trajectory of the secondary particles expanded by an influence of charging is focused by a lens generated by an axisymmetric electrode.

CITATION LIST

Patent Literature

PTL 1: JP-A-2005-345272
PTL 2: JP-A-2008-27737

SUMMARY OF INVENTION

Technical Problem

However, in PTL 1, since the secondary particles are focused after the off-axis deflection of the primary particle beam, the secondary particles that cannot be incident on the axisymmetric electrode due to expansion before deflection are not detected, and in order to detect more secondary particles, it is necessary to increase the size of the axisymmetric electrode or the like, that is, to increase the size of the charged particle beam apparatus. In PTL 2, although an axisymmetric electrode is arranged on an axis, an electric field around the electrode leaks and interferes with other optical elements, so that an influence on a primary particle beam is large. In order to prevent the interference, it is necessary to increase a distance between the axisymmetric electrode and the other optical elements, and it is necessary to increase the size of the charged particle beam apparatus.

An object of the invention is to improve detection efficiency of secondary particles without increasing the size of a charged particle beam apparatus.

Solution to Problem

In order to achieve the above object, the invention includes a focusing lens electrode arranged coaxially with a primary particle beam and configured to focus a trajectory of secondary particles, and a mesh electrode configured to reduce leakage of an electric field of the focusing lens electrode on a trajectory of the primary particle beam.

More specifically, a charged particle beam apparatus according to the invention includes: a charged particle beam source configured to irradiate a sample with a primary particle beam; a scanning deflector configured to scan and deflect the primary particle beam to a desired position of the sample; and a detector configured to detect secondary particles emitted from the desired position. The charged particle beam apparatus further includes: a focusing lens electrode arranged coaxially with the primary particle beam and configured to generate a focusing electric field that is an electric field that focuses a trajectory of the secondary particles; and a mesh electrode configured to reduce leakage of the focusing electric field on a trajectory of the primary particle beam.

Advantageous Effect

According to the invention, the detection efficiency of the secondary particles can be improved without increasing the size of the charged particle beam apparatus.

DESCRIPTION OF EMBODIMENTS

Embodiments of a charged particle beam apparatus according to the invention will be described below with reference to the figures. The charged particle beam apparatus is an apparatus that irradiates a sample with a charged particle beam (primary particle beam) and detects charged particles (secondary particles) emitted from the sample, thereby forming an image for observing the sample. For example, there are various apparatuses such as a scanning electron microscope and a transmission electron microscope that observe a sample by irradiating the sample with an electron beam, and a focused ion beam apparatus that observes the sample by irradiating the sample with a focused ion beam. Hereinafter, the scanning electron microscope will be described as an example of the charged particle beam apparatus.

First Embodiment

Figure 1:
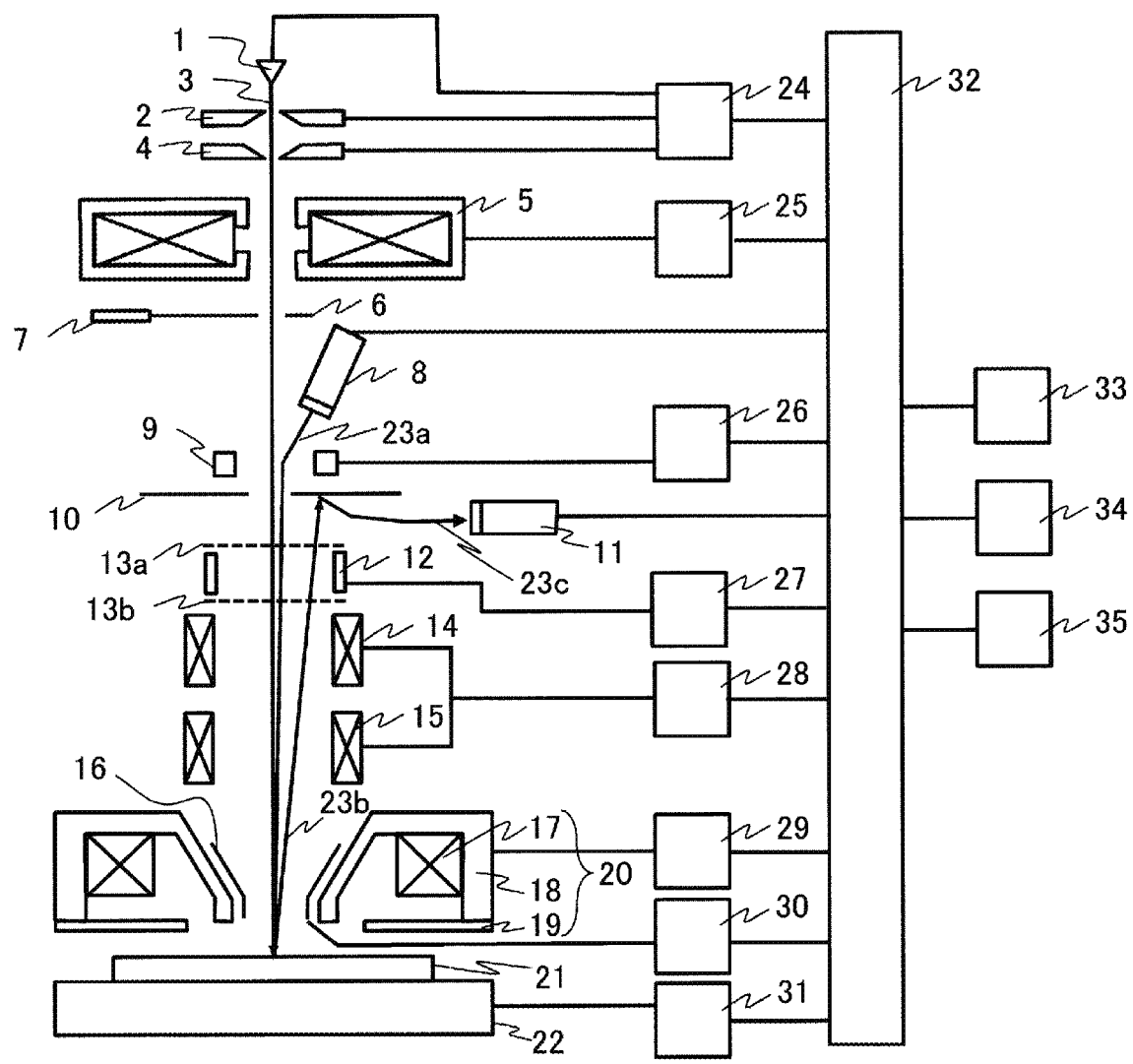
FIG. 1 is a schematic diagram showing a scanning electron microscope according to a first embodiment.

FIG. 1 is a schematic diagram showing a scanning electron microscope according to a first embodiment of the invention. In the present embodiment, in order to measure a length of a pattern created on a large sample such as a semiconductor wafer and inspect for defects and foreign matters on the pattern, energy of an electron beam, which is a primary particle beam, is set to low incident energy of several 10 eV to several keV. However, the invention can be applied even when the energy of the electron beam is large according to a target sample or object.

A control calculation device 32 reads conditions stored in a control table 35, and uses an electron gun control unit 24, a focusing lens control unit 25, a Wien filter control unit 26, a focusing lens electrode control unit 27, a scanning deflector control unit 28, an objective lens control unit 29, an acceleration electrode control unit 30, and a sample holder control unit 31 to set a voltage and a current in the device. When an operator instructs to change a measurement condition, the control calculation device 32 reads the control table 35 and changes a control parameter.

When an extraction voltage is applied between a cathode 1 and an extraction electrode 2, electrons 3 are emitted from the cathode 1. The emitted electrons 3 are accelerated between the extraction electrode 2 and an anode 4 at a ground potential. The energy of the electron beam, which is the electrons 3 passing through the anode 4, coincides with an acceleration voltage between the cathode 1 and the anode 4. An electron beam (primary particle beam) passing through the anode 4 is focused by a focusing lens 5 and passes through a primary particle beam diaphragm 6, and is narrowed down by an objective lens 20 to reach a sample 21 after being subjected to scanning deflection by an upper scanning deflector 14 and a lower scanning deflector 15, which are scanning deflectors. The objective lens 20 has an objective lens coil 17, an upper magnetic pole 18, and a lower magnetic pole 19. A magnetic field generated by the objective lens coil 17 is leaked from a gap between the upper and lower magnetic poles and concentrated on an axis of the primary particle beam, so that the primary particle beam is narrowed down. The narrowing-down of the primary particle beam is adjusted by changing a current amount of the objective lens coil 17.

A negative voltage is applied to a sample holder 22. The primary particle beam passing through the objective lens 20 is decelerated by a deceleration electric field created between the objective lens 20 and the sample 21, and reaches the sample 21. Since the primary particle beam when passing through the objective lens 20 has higher energy than when the primary particle beam reaches the sample 21, chromatic aberration in the objective lens 20 is reduced as compared with a case where the primary particle beam having the energy when reaching the sample 21 passes through the objective lens 20. As a result, even with low incident energy, a thinner electron beam is obtained to achieve higher resolution.

An aperture angle of the primary particle beam at the objective lens 20 is determined by the primary particle beam diaphragm 6 arranged below the focusing lens 5. Centering of the primary particle beam with respect to the primary particle beam diaphragm 6 may be mechanically adjusted using an adjustment knob 7, or may be adjusted by deflecting the primary particle beam using an electrostatic deflector or a magnetic field deflector separately provided before and after the primary particle beam diaphragm 6. The primary particle beam narrowed down by the objective lens 20 is scanned on the sample 21 by the upper scanning deflector 14 and the lower scanning deflector 15. Deflection directions and intensities of the upper scanning deflector 14 and the lower scanning deflector 15 are adjusted so that the primary particle beam is orthogonally incident on the sample 21.

When the sample 21 is irradiated with the primary particle beam, secondary particles 23a and 23b are generated. The deceleration electric field generated between the objective lens 20 and the sample 21 acts as an acceleration electric field for the secondary particles 23a and 23b. As a result, the secondary particles 23a and 23b are attracted into a passage of the objective lens 20, and are directed to an upper side of the apparatus while being subjected to a lens action by the acceleration electric field by an acceleration electrode 16 and the magnetic field of the objective lens 20. Here, an another electrode is not provided as the acceleration electrode 16, and the upper magnetic pole 18 of the objective lens 20 may be used as the acceleration electrode, and a voltage may be independently applied to the upper magnetic pole 18. Since the voltage is applied only to the upper magnetic pole 18, the upper magnetic pole 18 is insulated from the lower magnetic pole 19 by leaving a space or sandwiching an insulator therebetween.

The secondary particles 23a whose angle with an optical axis that is an axis of the primary particle beam is smaller than that of the secondary particles 23b are deflected off the axis of the primary particle beam by a Wien filter 9 after passing through a hole of a diaphragm 10, and are detected by an upper detector 8 arranged closer to the cathode 1 side than the diaphragm 10. The secondary particles generated by deflecting the secondary particles 23a off the axis and then colliding with a reflection plate provided separately may be detected.

The secondary particles 23b, whose angle with the optical axis is larger than that of the secondary particles 23a, collide with the diaphragm 10. Secondary particles 23c generated by the collision of the secondary particles 23b to the diaphragm 10 are detected by a lower detector 11 arranged closer to the sample 21 than the diaphragm 10. Instead of the diaphragm 10, the secondary particles 23b may be detected using a micro-channel plate or a semiconductor detector. An image formed of the secondary particles 23a and the secondary particles 23b detected by the upper detector 8 and the lower detector 11 is displayed on a monitor 34 and stored in a recording device 33.

Figure 2A:
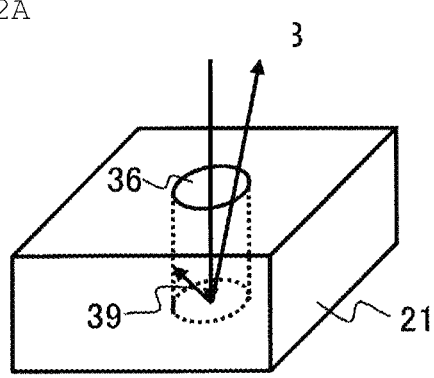
FIGS. 2A and 2B are schematic diagrams of a hole and a trench to be observed by the scanning electron microscope.
Figure 2B:
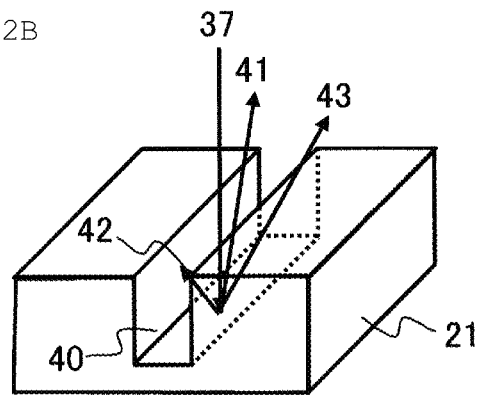

A trajectory of the secondary particles when observing the bottom of a hole 36 or a trench 40 of the sample 21 will be described with reference to FIG. 2. FIG. 2A is an example of the sample 21 having the hole 36. FIG. 2B is an example of the sample 21 having the trench 40. When the sample 21 having the hole 36 is irradiated with a primary particle beam 37, secondary particles 38 and 39 are emitted from the bottom of the hole 36, the secondary particles 38 having a small angle with an axis of the primary particle beam 37 escape from the hole 36, and the secondary particles 39 with a large angle with the axis of the primary particle beam 37 collide with a wall surface of the hole 36. In a case of the sample 21 having the trench 40, secondary particles 41 to 43 are emitted from the bottom, the secondary particles 41 having a small angle and the secondary particles 43 having a large angle and emitted in a longitudinal direction of the trench 40 escape from the trench 40. On the other hand, the secondary particles 42 having a large angle and emitted in a direction perpendicular to the longitudinal direction of the trench 40 collide with a wall surface of the trench 40. In this way, in the hole 36 and the trench 40, it is determined whether or not the secondary particles can escape from the hole 36 or the trench 40 depending on a magnitude of the angle formed with the axis of the primary particle beam 37 and an orientation with respect to the longitudinal direction of the trench 40.

Figure 3A:
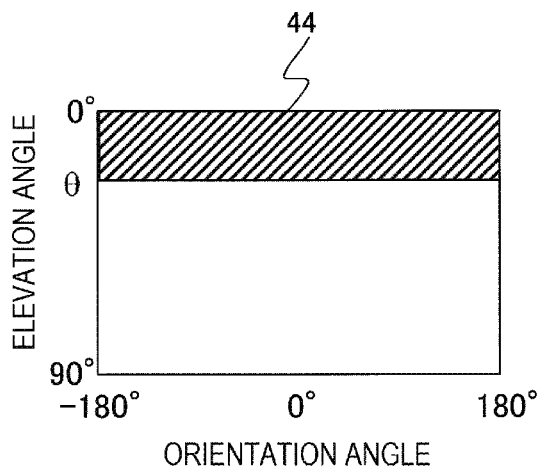
FIGS. 3A and 3B are examples of an angular distribution of secondary particles that can escape from the bottom of the hole and the trench to a cathode 1 side.
Figure 3B:
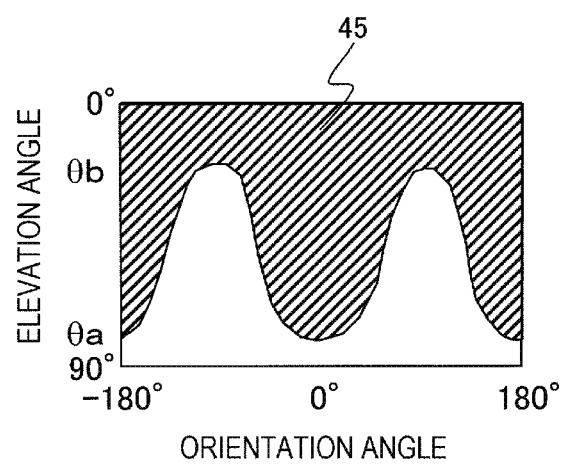

An angular distribution of the secondary particles that can escape when a center of the hole or trench is irradiated with the primary particle beam will be described with reference to FIG. 3. FIG. 3A shows the case of the hole, and FIG. 3B shows the case of the trench. A vertical axis represents an elevation angle that is an angle formed with the axis of the primary particle beam, and a horizontal axis represents an azimuth angle that is a rotation angle of the sample 21 in a horizontal plane. The elevation angle is 0° right above and 90° right beside, and the azimuth angle is 0° and ±180° in the longitudinal direction of the trench, and ±90° in the direction perpendicular to the longitudinal direction. In the hole, the secondary particles can escape in a range of elevation angles from 0° to θ in all azimuth angles (region 44). Independence of the azimuth angle is not observed since the hole has a rotationally symmetric shape. The elevation angle θ is a value determined by the shape of the hole, and is 26.6° when an aspect ratio (ratio of hole diameter to depth) is 1, for example. On the other hand, in the trench, a range of elevation angle of the secondary particles that can escape depends on the azimuth angle. In the longitudinal direction (0°, ±180°) of the trench, the range is from 0° to θa, whereas in the direction perpendicular to the longitudinal direction (±90°), the range is a narrow range from 0° to θb (region 45). The angle θa is determined by a ratio of trench length to depth, and the angle θb is determined by a ratio of trench width to depth. Secondary particles not shown in FIG. 2B, which collide with a wall of the trench in the longitudinal direction, that is, secondary particles having an elevation angle in the range of θa to 90° cannot escape from the trench.

In order to observe the bottom of the hole or the trench, it is important to improve the detection efficiency of the secondary particles having a small elevation angle escaping from the bottom. In the present embodiment, by providing a focusing lens electrode 12 arranged coaxially with the primary particle beam to focus the trajectory of the secondary particles 23b and mesh electrodes 13a and 13b that reduce leakage of the electric field from the focusing lens electrode 12, the detection efficiency of the secondary particles having a small elevation angle is improved. The focusing lens electrode 12 and the mesh electrodes 13a and 13b will be described.

The focusing lens electrode 12 is formed of a metal material, has a rotationally symmetric shape with respect to an optical axis, for example, a cylindrical structure, and generates a focusing electric field that is an electric field that focuses the trajectory of the secondary particles by applying a voltage. Since the focusing lens electrode 12 has the rotationally symmetric shape, it is possible to prevent the influence of a focusing electric field other than the shape of the primary particle beam uniformly spreading in all directions on a plane orthogonal to the optical axis. The focusing lens electrode 12 is arranged coaxially with the primary particle beam between the upper scanning deflector 14 and the upper detector 8. Since the focusing lens electrode 12 is arranged coaxially with the primary particle beam, the secondary particles are focused before being deflected by the Wien filter 9, so that the detection efficiency of the secondary particles can be improved. Since the focusing lens electrode 12 is arranged closer to the upper detector 8 than the upper scanning deflector 14, the focusing electric field of the focusing lens electrode 12 does not act on the primary particle beam after scanning and deflection.

The mesh electrodes 13a and 13b are formed of a metal material, have a rotationally symmetric shape with respect to the optical axis, have an opening (not shown) at the center through which the primary particle beam can pass, and have a so-called mesh shape in which a large number of holes or polygonal holes are formed at positions other than the center. In addition, the mesh electrodes 13a and 13b are electrically insulated from the focusing lens electrode 12 by leaving a space or sandwiching an insulator therebetween, and a voltage is independently applied to each of them. As shown in FIG. 1, the mesh electrodes 13a and 13b may be provided above and below the focusing lens electrode 12 respectively, or only the mesh electrode 13a may be arranged on an upper side of the focusing lens electrode 12 or only the mesh electrode 13b may be arranged on a lower side of the focusing lens electrode 12.

Figure 4:
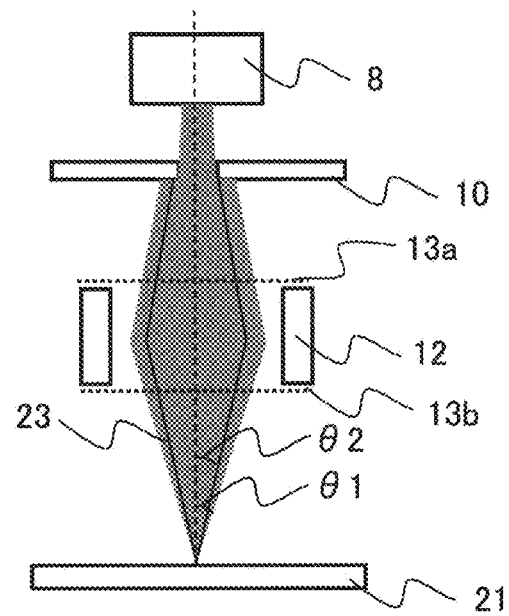
FIG. 4 is a schematic configuration diagram illustrating a focusing effect on the secondary particles by a focusing lens electrode and a mesh electrode.
Figure 5:
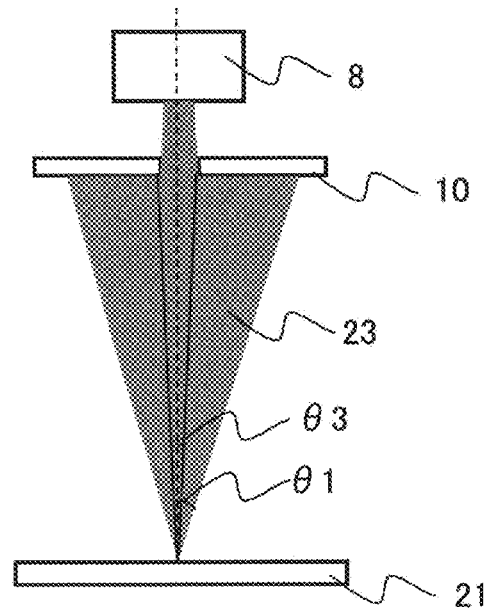
FIG. 5 is a comparison diagram with FIG. 4 and is a schematic configuration diagram in a case where the focusing lens electrode and the mesh electrode are not provided.

The focusing effect on the secondary particles by providing the focusing lens electrode 12 and the mesh electrodes 13a and 13b will be described with reference to FIGS. 4 and 5. FIG. 4 is a schematic configuration diagram of a case where the focusing lens electrode 12 and the mesh electrodes 13a and 13b are provided. The sample 21, the secondary particles 23, the focusing lens electrode 12, the mesh electrodes 13a and 13b, the diaphragm 10, and the upper detector 8 among the configuration shown in FIG. 1 are extracted and shown. FIG. 5 is a comparison diagram with FIG. 4, and is a schematic configuration diagram in the case where the focusing lens electrode 12 and the mesh electrodes 13a and 13b are not provided.

In FIG. 4, the secondary particles 23 emitted from the sample 21 with a spread of elevation angle θ1 are focused by the focusing electric field of the focusing lens electrode 12 and reach the diaphragm 10. The secondary particles having the elevation angle of el to 90° collide with a column or the other elements before reaching the diaphragm 10, and are not shown. Among the secondary particles 23 that reach the diaphragm 10, the secondary particles 23 having an elevation angle of 0° to θ pass through the hole of the diaphragm 10 and are detected by the upper detector 8. The amount of the secondary particles 23 passing through the diaphragm 10 changes depending on a magnitude of the focusing effect of the focusing lens electrode 12, and the magnitude of the focusing effect can be controlled by a voltage applied to the focusing lens electrode 12. The voltage applied to the focusing lens electrode 12 may be a positive voltage or a negative voltage. When a positive voltage is applied to the focusing lens electrode 12, the secondary particles are accelerated in the vicinity of the focusing lens electrode 12, and thus a higher focusing effect can be obtained by applying a negative voltage even if an absolute value is the same.

In FIG. 5, the secondary particles 23 emitted from the sample 21 with the spread of the elevation angle θ1 reach the diaphragm 10. Among the secondary particles 23 that have reached the diaphragm 10, the secondary particles 23 having an elevation angle of 0° to θ3 pass through the hole of the diaphragm 10 and are detected by the upper detector 8. The amount of the secondary particles 23 passing through the diaphragm 10 is determined by the size of the hole of the diaphragm 10.

Figure 6:
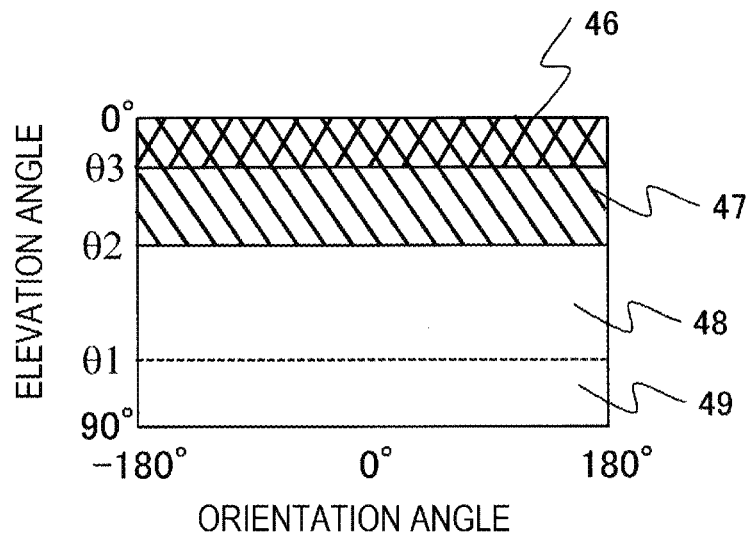
FIG. 6 is a diagram illustrating an angular range of the secondary particles detected by an upper detector.

An angular range of the secondary particles detected by the upper detector 8 in FIGS. 4 and 5 will be described with reference to FIG. 6. In FIG. 6, a vertical axis represents an elevation angle that is an angle formed by the optical axis of the primary particle beam, and a horizontal axis represents an azimuth angle that is a rotation angle of the sample 21 in a horizontal plane. In the configuration of FIGS. 4 and 5, since the shapes of the hole of the diaphragm 10 and the focusing lens electrode 12 are rotationally symmetric with respect to the optical axis of the primary particle beam, the detected secondary particles depend only on the elevation angle and do not depend on the azimuth angle. In the configuration of FIG. 5, that is, in the configuration in which the focusing lens electrode 12 and the mesh electrodes 13*a* and 13*b* are not provided, the secondary particles having an elevation angle from 0° to θ3, as a region 46 in FIG. 6, are detected. On the other hand, in the configuration of FIG. 4, that is, in the configuration in which the focusing lens electrode 12 and the mesh electrodes 13*a* and 13*b* are provided, the secondary particles having an elevation angle from 0° to θ2, as a region 47 in FIG. 6, are detected. By controlling the voltage applied to the focusing lens electrode 12, θ2 can be adjusted in a range from θ3 to θ1. A region 48 in FIG. 6 is an angular range of the secondary particles from the elevation angle θ2 to θ1 colliding with the diaphragm 10 in the configuration of FIG. 5. A region 49 is an angular range of the secondary particles from an elevation angle θ1 to 90° colliding with a column or the other elements.

Figure 7A:
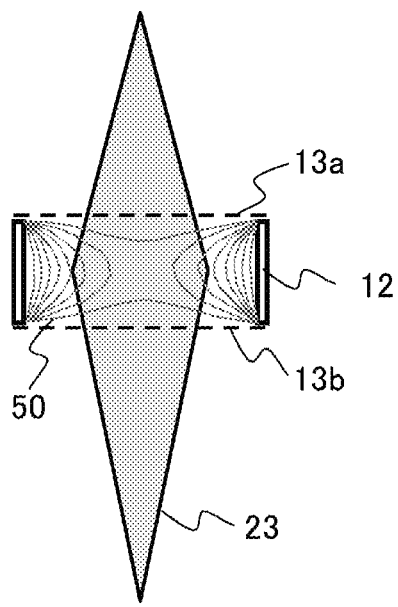
FIGS. 7A and 7B are diagrams illustrating the focusing effect of the secondary particles due to provision of the mesh electrode.
Figure 7B:
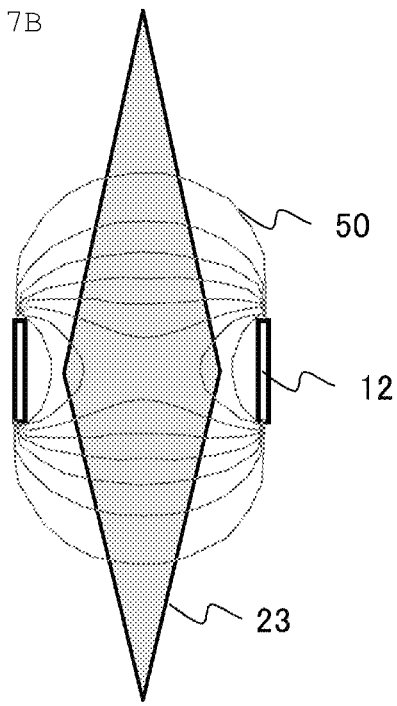

The focusing effect on the secondary particles by providing the mesh electrodes 13*a* and 13*b* will be described with reference to FIG. 7. FIG. 7A is a schematic diagram of equipotential lines and trajectories of the secondary particle when the mesh electrodes 13*a* and 13*b* are provided. FIG. 7B is a comparison diagram with FIG. 7A and is a schematic diagram when the mesh electrodes 13*a* and 13*b* are not provided. The same voltage is applied to the focusing lens electrode 12 in both FIGS. 7A and 7B.

In FIG. 7A, the mesh electrodes 13*a* and 13*b* are arranged above and below the focusing lens electrode 12. The mesh electrodes 13*a* and 13*b* are flat plate shapes that are perpendicular to the optical axis and parallel to each other. In addition, by inserting an insulator between the mesh electrodes 13*a* and 13*b* and the focusing lens electrode 12 or leaving a space therebetween, the mesh electrodes and the focusing lens electrode are electrically insulated and a voltage is independently applied to each. In the present embodiment, the mesh electrodes 13*a* and 13*b* are grounded.

With the configuration shown in FIG. 7A, the focusing electric field generated by the focusing lens electrode 12 is suppressed between the mesh electrodes 13*a* and 13*b*, equipotential lines 50 are closely spaced, and a sharp potential gradient is formed. On the other hand, in FIG. 7B, the focusing electric field generated by the focusing lens electrode 12 leaks to the top and bottom of the focusing lens electrode 12, and an interval between the equipotential lines 50 becomes coarser and the potential gradient becomes gentler than in FIG. 7A. That is, the mesh electrodes 13*a* and 13*b* have an effect of shielding the focusing electric field of the focusing lens electrode 12, and an electric field distribution created by the focusing lens electrode 12 is formed between the mesh electrodes 13*a* and 13*b* by arranging the mesh electrodes 13*a* and 13*b*. When the electric field distribution is formed, the trajectory of the secondary particles 23 also changes, and the focusing effect of the secondary particles 23 at the position of the diaphragm 10 can be increased.

Figure 8:
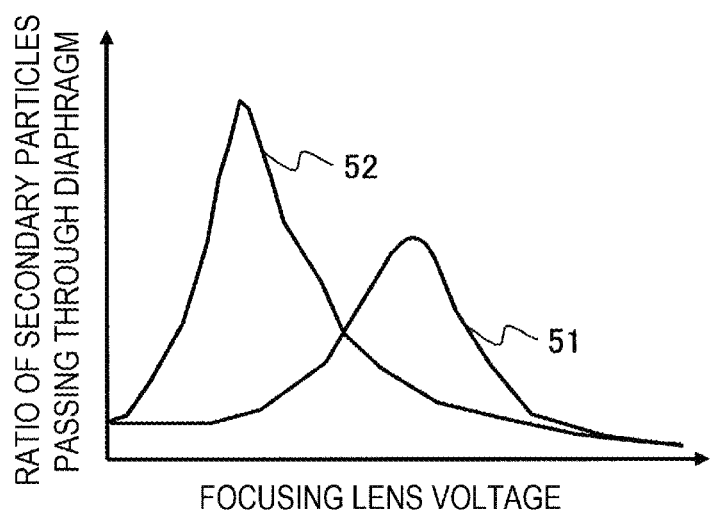
FIG. 8 is a diagram illustrating a difference in the focusing effect of the secondary particles due to presence or absence of the mesh electrode.

A difference in the focusing effect of the secondary particles 23 due to the presence or absence of the mesh electrodes 13*a* and 13*b* will be described with reference to FIG. 8. In FIG. 8, a vertical axis represents a ratio of the secondary particles passing through the hole of the diaphragm 10, and a horizontal axis represents a value of the voltage applied to the focusing lens electrode 12. A curve 51 shows a simulation result when the mesh electrodes 13*a* and 13*b* are not provided, and a curve 52 shows a case where the mesh electrodes 13*a* and 13*b* are provided.

In FIG. 8, regardless of the presence or absence of the mesh electrodes 13*a* and 13*b*, the ratio of the secondary particles passing through the diaphragm 10 increases as the voltage of the focusing lens electrode 12 increases, and decreases after reaching the peak. The reason why the ratio of the secondary particles passing through the diaphragm 10 increases as the voltage of the focusing lens electrode 12 increases is that the focusing effect becomes stronger and the secondary particles are narrowed down. The voltage at the peak is a voltage at which the secondary particles are most focused in the diaphragm 10. When a larger voltage is applied, the secondary particles are once narrowed down on the focusing lens electrode 12 side with respect to the diaphragm 10 and then spread and collide with the diaphragm 10, so that the ratio of the secondary particles passing through the diaphragm 10 is reduced.

In the case of the curve 52, that is, the mesh electrodes 13*a* and 13*b* are provided, the voltage at the peak is lower than that in the case of the curve 51, that is, the mesh electrodes 13*a* and 13*b* are not provided. In addition, the ratio of the secondary particles passing through the diaphragm 10 at the peak is larger in the curve 52 than in the curve 51. These are caused by the fact that the secondary particles, which are not focused on the diaphragm 10 when the mesh electrodes 13*a* and 13*b* are not provided due to a short focus, are focused when the mesh electrodes 13*a* and 13*b* are provided. As a result of the above, since the focusing lens electrode 12 includes the mesh electrodes 13*a* and 13*b*, the focusing effect of the secondary particles can be increased, and the voltage at the peak can be reduced.

The reduction in the voltage at the peak can reduce an adverse effect on the electron beam that is the primary particle beam. When a negative voltage is applied to the focusing lens electrode 12, the electron beam is decelerated at the position of the focusing lens electrode 12. The deceleration of the electron beam results in an increase in the chromatic aberration, causing a reduction in resolution on the sample 21. By reducing the voltage applied to the focusing lens electrode 12, the amount by which the electron beam is decelerated is reduced, and the reduction in the resolution is prevented. Further, it is possible to prevent reduction in optical performance when the focusing lens electrode 12 is displaced from the optical axis and an axisymmetric field is broken. That is, it is possible to reduce the adverse effect on the electron beam that is the primary particle beam by lowering the voltage applied to the focusing lens electrode 12.

Furthermore, since the electric field distribution created by the focusing lens electrode 12 is formed between the mesh electrodes 13a and 13b, a distance that the focusing electric field of the focusing lens electrode 12 acts on the primary particle beam is shortened. As a result, required accuracy when the center of the focusing lens electrode 12 matches the optical axis is reduced, and a likelihood of assembly accuracy of the focusing lens electrode 12 is increased. As a result, providing the mesh electrodes 13a and 13b brings good effects not only on the secondary particles but also on the primary particle beam.

Figure 9A:
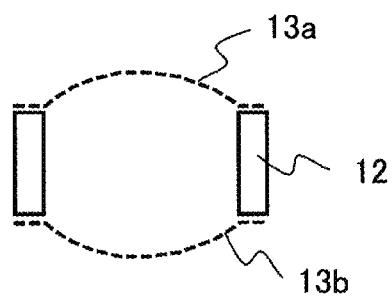
FIGS. 9A, 9B, 9C, and 9D are examples showing a shape of the mesh electrode according to the first embodiment.
Figure 9B:
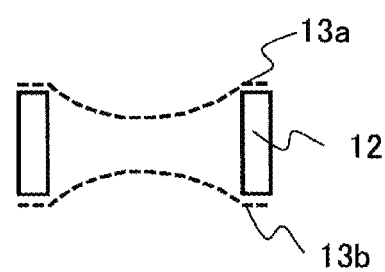
Figure 9C:
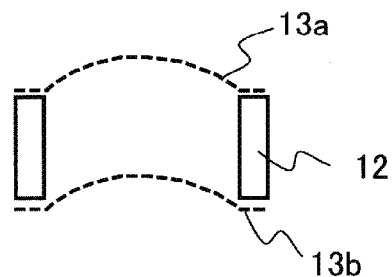
Figure 9D:
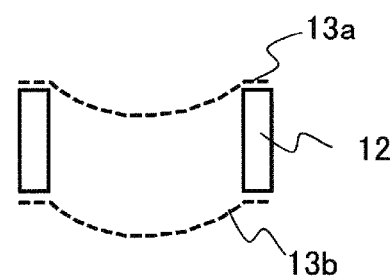

The shape of the mesh electrodes 13a and 13b is not limited to a flat surface, and may be any shape as long as the electric field distribution created by the focusing lens electrode 12 can be formed. Another specific example of the shape of the mesh electrodes 13a and 13b will be described with reference to FIG. 9. The mesh electrodes 13a and 13b in FIG. 9A have a curved surface shape bent in a direction away from the focusing lens electrode 12, and a stronger focusing effect can be obtained than in the case where the mesh electrodes 13a and 13b are not provided. FIG. 9B has a curved surface shape bent toward the focusing lens electrode 12 side, and a stronger focusing effect than that of the flat plate shape can be obtained. FIGS. 9C and 9D have curved surface shapes with one being bent toward the focusing lens electrode 12 side and the other one being bent in the direction away from the focusing lens electrode 12. In FIGS. 9C and 9D, the focusing effect equivalent to that of the flat plate shape can be obtained, and a position exerting the focusing effect can be shifted above or below the focusing lens electrode 12. The mesh electrodes 13a and 13b do not necessarily have to be provided above and below the focusing lens electrode 12. Only the mesh electrode 13a above the focusing lens electrode 12 or only the mesh electrode 13b below the focusing lens electrode 12 may be provided. By using only one of the mesh electrodes 13a and 13b, it is possible to reduce the secondary particles that collide with the mesh electrode 13a or the mesh electrode 13b.

In this way, by changing the shape of the mesh electrodes 13a and 13b, the electric field distribution of the focusing lens electrode 12 can be changed arbitrarily. As a result, the magnitude of the focusing effect of the secondary particles can be controlled. It is desirable that the shapes of the focusing lens electrode 12 and the mesh electrodes 13a and 13b are appropriately changed according to the energy and spread of the secondary particles at the position of the focusing lens electrode 12, the position of the diaphragm 10 and the size of the hole, the magnitude of the desired focusing effect, or the like. The shape of each electrode may be optimized by simulation or experiment.

Figure 10:
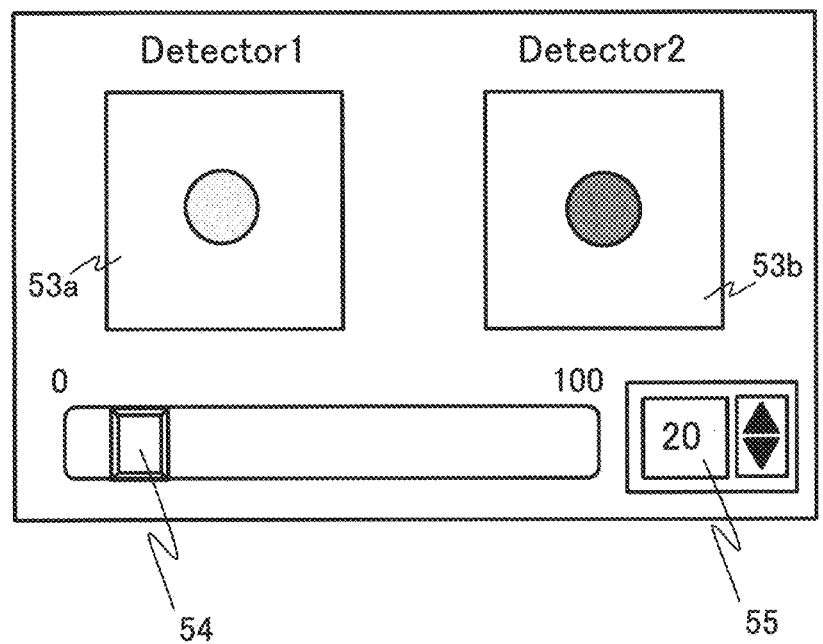
FIG. 10 is a diagram showing an example of a GUI that designates a detection angle of the secondary particles by using the scanning electron microscope according to the first embodiment.

FIG. 10 shows an example of a graphical user interface (GUI) in which an operator designates a detection angle of the secondary particles. The GUI in FIG. 10 includes a first image display unit 53a, a second image display unit 53b, a slider 54, and an angle designation box 55, is displayed on the monitor 34 and is operated by the operator. An image formed based on the detection by the upper detector 8 is displayed on the first image display unit 53a. An image formed based on the detection by the lower detector 11 is displayed on the second image display unit 53b. In the slider 54 or the angle designation box 55, the range of the elevation angle detected by the upper detector 8 is set as a dimensionless numerical value of 0 to 100. The numerical value displayed on the slider 54 or the angle designation box 55 may be a numerical value corresponding to the range of the elevation angle, or may be a numerical value corresponding to the voltage of the focusing lens electrode 12. With the GUI in FIG. 10, it is possible to simultaneously observe the images formed based on the detection by the upper detector 8 and the lower detector 11. The image shown in FIG. 10 is an example when a hole pattern in which a hole is formed is observed, and the inside of the hole is brighter in the first image display unit 53a than in the second image display unit 53b.

Figure 11:
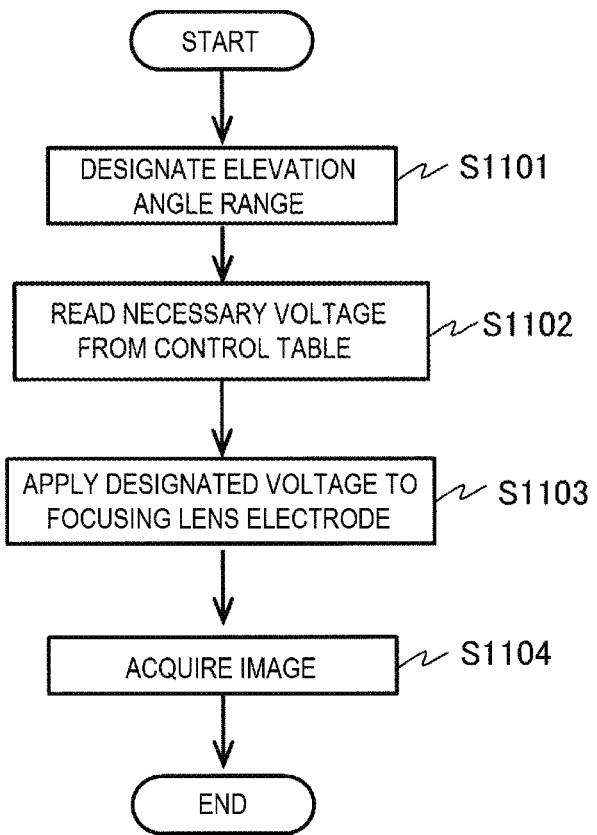
FIG. 11 is a flowchart of acquiring an image by designating the detection angle of the secondary particles by using the scanning electron microscope according to the first embodiment.

FIG. 11 shows a flowchart of acquiring an image under a condition that the range of elevation angle is changed according to the detection angle designated via the GUI in FIG. 10. Hereinafter, each step will be described. The operator uses the slider 54 or the angle designation box 55 to designate a range of the elevation angle detected by the upper detector 8 (S1101). The control calculation device 32 reads a relationship between the elevation angle range and the voltage of the focusing lens electrode 12 for each optical condition stored in the control table 35, and selects a voltage of the focusing lens electrode 12 that satisfies the elevation angle range designated in S1101 (S1102). The relationship between the elevation angle range and the voltage of the focusing lens electrode 12 may be created based on a simulation result using electromagnetic field calculation and electron trajectory calculation, or may be created based on an experimental result. The focusing lens electrode control unit 27 applies the voltage selected in S1102 to the focusing lens electrode 12 (S1103). The control calculation device 32 acquires an image formed based on the detection of the secondary particles by the upper detector and the lower detector (S1104).

In this way, by adjusting the voltage applied to the focusing lens electrode 12 including the mesh electrodes 13a and 13b, the range of the elevation angle of the secondary particles passing through the hole of the diaphragm 10 can be arbitrarily controlled. The range of the elevation angle of the secondary particles that can be detected by the upper detector 8 can be adjusted by the shapes of the focusing lens electrode 12 and the mesh electrodes 13a and 13b. Further, since the mesh electrodes 13a and 13b are provided, the voltage of the focusing lens electrode 12 necessary for focusing the secondary particles can be reduced. Further, since the leakage of the electric field created by the focusing lens electrode 12 to the outside of the focusing lens electrode 12 can be prevented by the mesh electrodes 13a and 13b, it is possible to reduce the adverse effect on constituent elements, which are arranged in the vicinity of the focusing lens electrode 12, related to the control of the primary particle beam.

Second Embodiment

In the first embodiment, a configuration in which the focusing lens electrode 12 and the mesh electrodes 13a and 13b are arranged coaxially with the primary particle beam between the upper scanning deflector 14 and the upper detector 8 has been described. The position at which the focusing lens electrode 12 and the mesh electrodes 13a and 13b are arranged is not limited between the upper scanning deflector 14 and the upper detector 8. In the present embodiment, a configuration in which a focusing lens electrode 56 and a mesh electrode 57 are arranged coaxially with the primary particle beam between the lower scanning deflector 15 and the sample 21 will be described. The configurations other than the focusing lens electrode 56 and the mesh electrode 57 are the same as those of the first embodiment, and a description thereof will be omitted.

Figure 12:
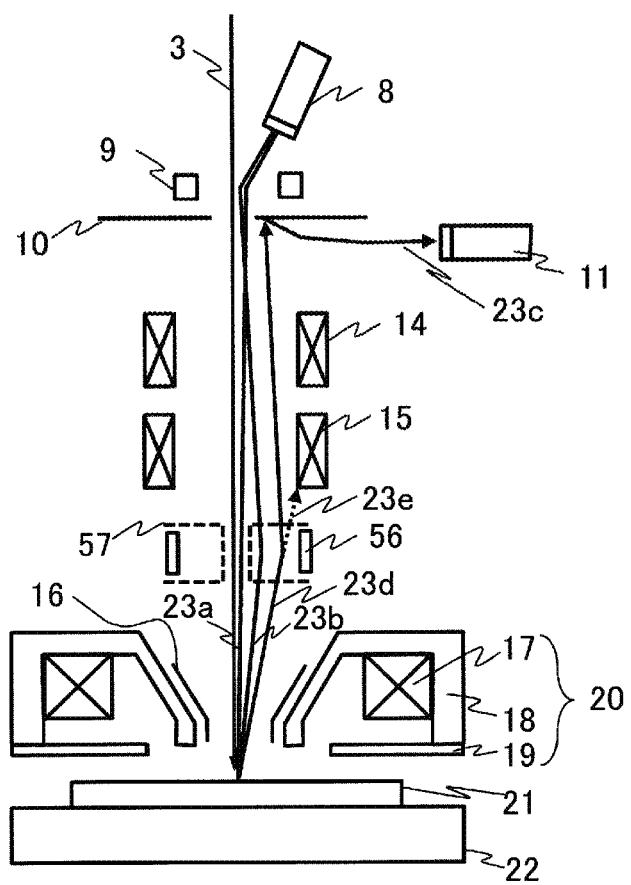
FIG. 12 is a schematic diagram showing a scanning electron microscope according to a second embodiment.

A second embodiment will be described with reference to FIG. 12. In order to simplify the description, only a structure below the upper detector 8 is shown in FIG. 12. The focusing lens electrode 56 and the mesh electrode 57 will be described.

The focusing lens electrode 56 is formed of a metal material as in the first embodiment, and has, for example, a cylindrical structure that is a rotationally symmetric shape with respect to the optical axis. When a voltage is applied to the focusing lens electrode 56, a focusing electric field that is an electric field that focuses a trajectory of the secondary particles is generated. The focusing lens electrode 56 is arranged coaxially with the primary particle beam between the lower scanning deflector 15 and the sample 21. Since the focusing lens electrode 56 is arranged coaxially with the primary particle beam, the detection efficiency of the secondary particles can be improved as in the first embodiment. Further, since the focusing lens electrode 56 is arranged closer to the sample 21 than the focusing lens electrode 12 in the first embodiment, the secondary particles that collide with a column or the like due to the large elevation angle in the first embodiment are focused by the focusing electric field of the focusing lens electrode 56 and detected, and thus the detection efficiency of the secondary particles can be improved.

As in the first embodiment, the mesh electrode 57 is formed of a metal material, has a rotationally symmetric shape with respect to the optical axis, and has a so-called mesh shape in which a large number of holes or polygonal holes are formed. Further, the mesh electrode 57 has a shape that does not allow the focusing electric field of the focusing lens electrode 56 to leak onto the trajectory of the primary particle beam, specifically, has a cylindrical shape that forms a hole through which the primary particle beam passes, and is arranged so as to cover the focusing lens electrode 56. Since the mesh electrode 57 has a shape that does not allow the focusing electric field of the focusing lens electrode 56 to leak onto the trajectory of the primary particle beam, the primary particle beam that is scanned and deflected by the upper scanning deflector 14 and the lower scanning deflector 15 and is off the optical axis does not need to be further deflected. When the electric field of the focusing lens electrode 56 acts on the primary particle beam traveling on the optical axis, although the shape of the primary particle beam spreads uniformly in all directions on the plane orthogonal to the optical axis, the spread can be compensated by finely adjusting a focus value of the objective lens 20 and a voltage of the sample holder 22.

Among the secondary particles emitted from the sample 21, the secondary particles 23a passing near the optical axis of the primary particle beam pass through the hole of the diaphragm 10 and are detected by the upper detector 8 without being affected by the focusing electric field of the focusing lens electrode 56. The secondary particles 23b emitted at a slightly larger elevation angle than the secondary particles 23a are deflected in an optical axis direction by the focusing electric field of the focusing lens electrode 56, pass through the hole of the diaphragm 10 and are detected by the upper detector 8. Secondary particles 23d having an elevation angle larger than that of the secondary particles 23b become secondary particles 23e that collide with the lower scanning deflector 15 when no voltage is applied to the focusing lens electrode 56. When the voltage is applied to the focusing lens electrode 56, the secondary particles 23d are deflected in the optical axis direction to collide with the diaphragm 10 to generate the secondary particles 23c detected by the lower detector 11. According to the present embodiment, the detection efficiency of the secondary particles can be controlled without adversely affecting the primary particle beam.

Figure 13A:
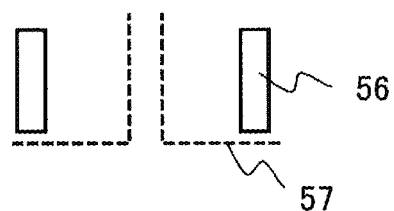
FIGS. 13A, 13B, 13C, 13D, and 13E are examples showing a shape of a mesh electrode according to the second embodiment.
Figure 13B:
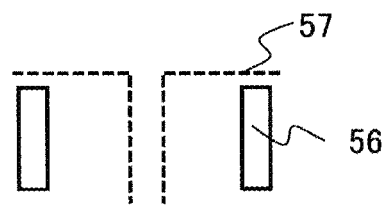
Figure 13C:
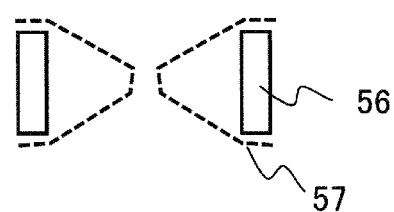
Figure 13D:
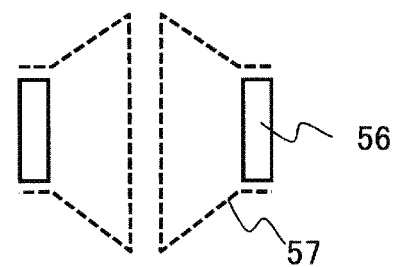
Figure 13E:
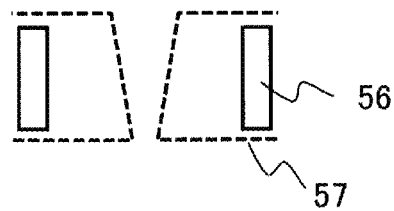

The shape of the mesh electrode 57 according to the present embodiment is not limited to FIG. 12, and any shape may be used as long as the electric field distribution created by the focusing lens electrode 56 is formed and the formed electric field distribution does not leak onto the trajectory of the primary particle beam after scanning deflection. Another specific example of the shape of the mesh electrode 57 will be described with reference to FIG. 13. The mesh electrode 57 of FIG. 13A has a shape in which a lower side of the focusing lens electrode 56, that is, the sample 21 side is covered, and an upper side, that is, the lower scanning deflector 15 side is opened. FIG. 13B shows a shape in which the upper side of the focusing lens electrode 56 is covered and the lower side thereof is opened. In FIGS. 13A and 13B, although the focusing electric field of the focusing lens electrode 56 leaks from the open side, the effect on the primary particle beam is smaller than in the first embodiment, and the secondary particles that collide with the mesh electrode 57 when the secondary particles escape upward can be halved. FIGS. 13C and 13D are examples in which a length of the mesh electrode 57 in FIG. 12 in the optical axis direction is changed. The longer the length of the mesh electrode 57 in the optical axis direction, the higher the focusing effect of the secondary particles. The mesh electrode 57 in FIG. 13E has a shape in which a portion thereof along the optical axis of the primary particle beam is inclined with respect to the optical axis. That is, the mesh electrode 57 has a truncated cone shape that forms a hole through which the primary particle beam passes. As shown in FIG. 4, since the secondary particles emitted from the sample 21 travels upward with a spread, it is possible to prevent the collision of the secondary particles with the mesh electrode 57 by making the mesh electrode 57 to be the truncated cone shape that matches the spread of the secondary particles.

Thus, by appropriately changing the shape of the mesh electrode 57, the focusing effect of the secondary particles can be adjusted while reducing the influence on the trajectory of the primary particle beam after the scanning deflection. The portion of the mesh electrode 57 along the optical axis of the primary particle beam may have a mesh shape as shown in FIG. 13 or a thin cylindrical shape. In the case of the thin cylindrical shape, the leakage of the focusing electric field to the trajectory of the primary particle beam after the scanning deflection can be prevented as compared with the mesh shape. The mesh electrode 57 shown in FIG. 13 may be applied to the configuration according to the first embodiment.

Figure 14:
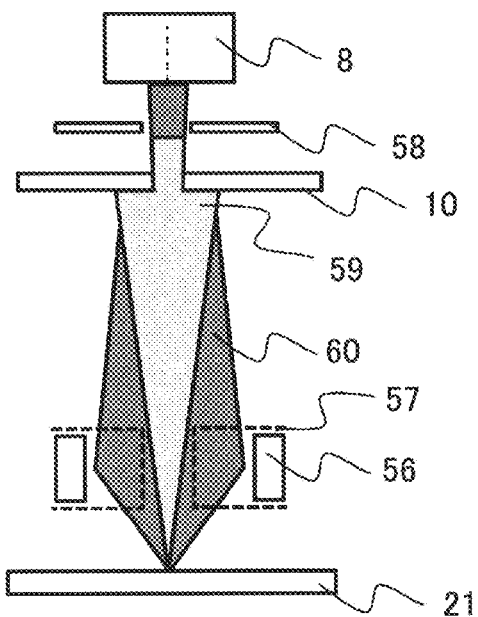
FIG. 14 is the scanning electron microscope according to the second embodiment, and is an example in which secondary electrons and backscattered electrons are detected separately.

An example of inspecting and measuring a semiconductor device pattern on a wafer as the sample 21 by using the configuration of the present embodiment is shown in FIG. 14. In order to simplify the description, the sample 21, the focusing lens electrode 56, the mesh electrode 57, secondary electrons 59, backscattered electrons 60, the diaphragm 10, an energy filter 58, and the upper detector 8 are extracted and shown in FIG. 14 as minimum necessary elements. The energy filter 58 is arranged between the diaphragm 10 and the upper detector 8, and a voltage obtained by adding a bias voltage of about −50 V to the voltage applied to the sample 21 is applied.

In the inspection and measurement of the semiconductor device pattern, after performing wafer alignment that corrects translation and rotation of the wafer and addressing that specifies a unique pattern near an observation location by moving the stage, an image is obtained by scanning and deflecting the primary particle beam to a place where the inspection and measurement are performed. It is desirable that an image with a high S/N is used for the wafer alignment and the addressing. In an apparatus configuration in FIG. 14, an image obtained by detecting the secondary particles, generated by the majority of the secondary electrons 59 of low energy (<50 eV) emitted from the sample 21 colliding with the diaphragm 10 with the lower detector (not shown), can be used.

The present configuration is effective when a material contrast or the like of a semiconductor device pattern to be inspected and measured is analyzed by a backscattered electron image. The backscattered electrons are higher in energy (>50 eV) than the secondary electrons, are small in the amount of electrons emitted from the sample (about $\frac{1}{10}$ of the secondary electrons), and a spread angle is small. Since the secondary electrons 59 that pass through the hole of the diaphragm 10 together with the backscattered electrons 60 are cut by an electric field of the energy filter 58, only the backscattered electrons 60 of high energy are detected by the upper detector 8. Although the backscattered electrons 60 collide with the diaphragm 10 together with the secondary electrons 59 to generate secondary particles, the amount of the secondary particles generated is about $\frac{1}{10}$ of the amount generated by the secondary electrons 59, and hardly contributes to the image at the lower detector. When a diameter of a center portion of the mesh electrode 57 is set to a size through which the secondary electrons 59 pass, only a trajectory of the backscattered electrons 60 is focused by the focusing electric field of the focusing lens electrode 56 without changing a trajectory of the secondary electrons 59.

That is, only an appearance of the backscattered electron image of the semiconductor device pattern can be controlled by adjusting the voltage of the focusing lens electrode 56 without changing an appearance of the secondary electron image during the wafer alignment and the addressing. At this time, since the focusing electric field of the focusing lens electrode 56 does not leak onto the trajectory of the primary particle beam, optical characteristics and the trajectory of the primary particle beam are not affected.

Third Embodiment

In the first and second embodiments, the focusing lens electrodes 12 and 56 have a rotationally symmetric shape with respect to the optical axis of the primary particle beam, and the detected secondary particles depend only on the elevation angle and do not depend on the azimuth angle. In the present embodiment, a configuration in which an azimuth angle of the detected secondary particles is controlled will be described. Since the configuration other than a focusing lens electrode 61 is the same as that of the second embodiment, a description thereof will be omitted.

Figure 15:
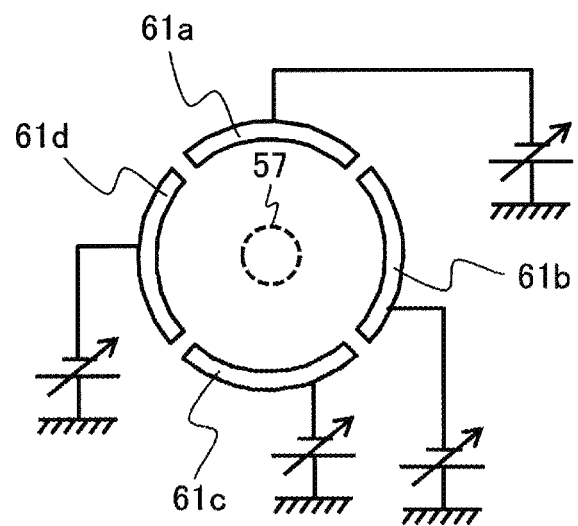
FIG. 15 is an example showing a shape of a focusing lens electrode according to a third embodiment.

A third embodiment will be described with reference to FIG. 15. FIG. 15 is a cross-sectional diagram in the vicinity of the center of the mesh electrode 57 in FIG. 12 and in a plane orthogonal to the optical axis of the primary particle beam. The focusing lens electrode 61 is divided into a plurality along a circumferential direction. The divided electrodes are arranged symmetrically with respect to the optical axis of the primary particle beam. Although four electrodes 61a to 61d are shown in FIG. 15, the number of divisions may be any number. The divided electrodes 61a to 61d are insulated from each other and are each individually connected to a variable power supply so that a voltage can be applied independently of each other. The mesh electrode 57 is provided at the center of the focusing lens electrode 61, and a focusing electric field of the focusing lens electrode 61 does not leak onto the trajectory of the primary particle beam by the mesh electrode 57.

The same voltage is applied to opposing electrodes of the divided electrodes 61a to 61d. For example, when the same voltage is applied to the electrodes 61a and 61c and no voltage is applied to the electrodes 61b and 61d, the secondary particles that have reached the mesh electrode 57 in orientations of the electrodes 61a and 61c are narrowed down as compared with orientations of the electrodes 61b and 61d. That is, the secondary particles in the orientation to which the voltage is applied are narrowed down, and the secondary particles in a wider elevation angle range are detected by passing through the diaphragm 10. Therefore, by applying separate voltages to the divided focusing lens electrodes 61a to 61d, the elevation angle range that can be detected can be controlled for each azimuth angle. The present configuration is particularly effective for the trench 40 given as an example in FIG. 2B. As shown in FIG. 3B, the elevation angle range from 0° to θa can be detected at the azimuth angles of 0° and ±180°, and the elevation angle range from 0° to θb can be detected at the azimuth angles of ±90°.

Fourth Embodiment

In the first embodiment, the configuration in which the focusing lens electrode 12 and the mesh electrodes 13a and 13b are arranged coaxially with the primary particle beam between the upper scanning deflector 14 and the upper detector 8 has been described. In the second embodiment, the configuration in which the focusing lens electrode 56 and the mesh electrode 57 are arranged coaxially with the primary particle beam between the lower scanning deflector 15 and the sample 21 has been described. In the present embodiment, the focusing lens electrode 12 and the mesh electrodes 13a and 13b are arranged between the upper scanning deflector 14 and the upper detector 8, and the focusing lens electrode 56 and the mesh electrode 57 are arranged between the lower scanning deflector 15 and the sample 21, which is a combination of the first embodiment and the second embodiment. Since the detailed configuration is the same as that of the first embodiment and the second embodiment, a description thereof will be omitted.

Figure 16:
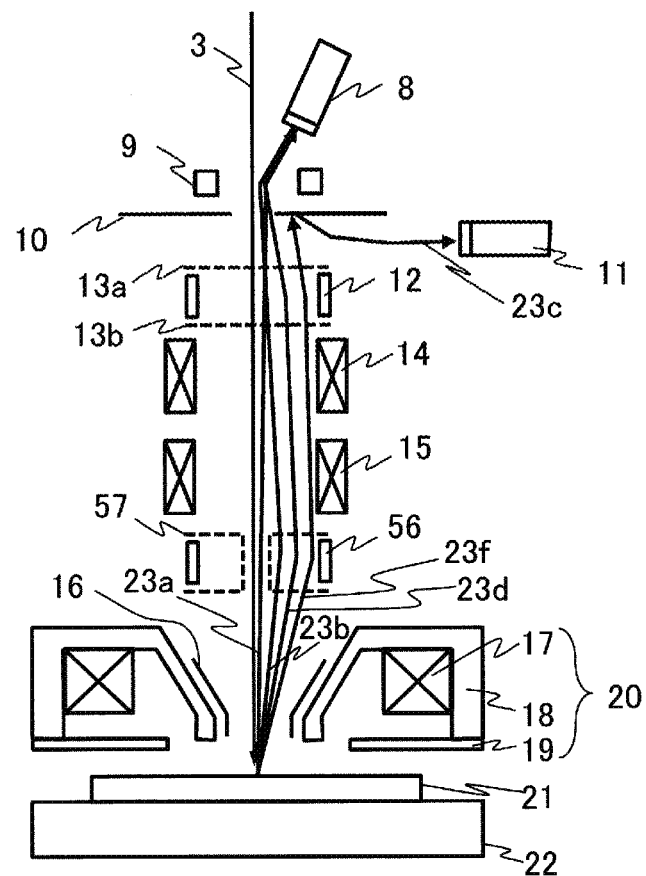
FIG. 16 is a schematic diagram showing a scanning electron microscope according to a fourth embodiment.

A fourth embodiment will be described with reference to FIG. 16. In order to simplify the description, only a structure below the upper detector 8 is shown in FIG. 16.

Among secondary particles emitted from the sample 21, the secondary particles 23a passing near the optical axis of the primary particle beam reach the mesh electrode 13b without being affected by the focusing electric field of the focusing lens electrode 56, pass through the hole of the diaphragm 10 after being deflected in the optical axis direction, and are detected by the upper detector 8. The secondary particles 23b emitted at a slightly larger elevation angle than the secondary particles 23a are deflected in the optical axis direction by the focusing electric fields of the focusing lens electrode 56 and the focusing lens electrode 12, and then pass through the hole of the diaphragm 10 and are detected by the upper detector 8. The secondary particles 23d emitted at a larger elevation angle than the secondary particles 23b and colliding with the diaphragm 10 in the configuration of FIG. 14 are deflected in the optical axis direction by the focusing electric fields of the focusing lens electrode 56 and the focusing lens electrode 12, and then pass through the hole of the diaphragm 10 and are detected by the upper detector 8. Secondary particles 23f emitted at an elevation angle larger than the secondary particles 23d are deflected in the optical axis direction by the focusing electric fields of the focusing lens electrode 56 and the focusing lens electrode 12, collide with the diaphragm 10, and generate the secondary particles 23c detected by the lower detector 11.

According to the present embodiment, the focusing effect of the secondary particles can be improved as compared with the first embodiment and the second embodiment. Further, the influence on the trajectory of the primary particle beam can be prevented, and the detection efficiency of secondary particles can be controlled. Further, since the secondary particles emitted from the sample 21 pass through the focusing lens electrode 56 and the mesh electrode 57, and the focusing lens electrode 12 and the mesh electrodes 13a and 13b until reaching the upper detector 8 or the lower detector 11, the detected elevation angle range can be finely controlled.

In the present embodiment, the focusing lens electrode 12 is arranged above the upper scanning deflector 14, and the focusing lens electrode 56 is arranged below the lower scanning deflector 15, but the focusing lens electrodes may be arranged between the upper scanning deflector 14 and the lower scanning deflector 15 or between the objective lens 20 and the sample 21. Further, three or more combinations of the focusing lens electrode and the mesh electrode may be provided. Since the combination of the focusing lens electrode and the mesh electrode, which is a feature of the invention, does not leak the focusing electric field of the focusing lens electrode to the outside of the mesh electrode, it is possible to prevent the influence on the element used for focusing and scanning deflection of the primary particle beam. Therefore, it is possible to set a combination of the focusing lens electrode and the mesh electrode in an arbitrary narrow region in the scanning electron microscope, and to reduce the size of the scanning electron microscope, particularly to shorten the column length, and to prevent a reduction in the optical performance.

The invention is not limited to the above embodiments, and includes various modifications. For example, the above embodiments have been described in detail for easy understanding of the invention, and the invention is not limited to those including all the configurations described above, and a part of the configurations may be omitted. Apart of the configuration of a certain embodiment may be replaced with a configuration of another embodiment, or the configuration of another embodiment may be added to the configuration of a certain embodiment.

REFERENCE SIGN LIST 1 cathode
2 extraction electrode
3 electron
4 anode
5 focusing lens
6 primary particle beam diaphragm
7 adjustment knob
8 upper detector
9 Wien filter
10 diaphragm
11 lower detector
12 focusing lens electrode
13 mesh electrode
14 upper scanning deflector
15 lower scanning deflector
16 acceleration electrode
17 objective lens coil
18 upper magnetic pole
19 lower magnetic pole
20 objective lens
21 sample
22 sample holder
23 secondary particles
24 electron gun control unit
25 focusing lens control unit
26 Wien filter control unit
27 focusing lens electrode control unit
28 scanning deflector control unit
29 objective lens control unit
30 acceleration electrode control unit
31 sample holder control unit
32 control calculation device
33 recording device
34 monitor
35 control table
36 hole
37 primary particle beam
38 secondary particles escaping from hole 36
39 secondary particle colliding with wall surface of hole 36 hole
40 trench
41 secondary particles escaping from trench 40
42 secondary particles colliding with wall surface of trench 40
43 secondary particles emitted in longitudinal direction of trench 40 and escaping from trench 40
44 region of secondary particles escaping from hole 36
45 region of secondary particles escaping from trench 40
46 region of secondary particles from elevation angle 0° to θ3
47 region of secondary particles from elevation angle 0° to θ2
48 region of secondary particles from elevation angle θ2 to θ1
49 region of secondary particles from elevation angle θ1 to 90°
50 equipotential lines
51 curve without mesh electrodes 13a and 13b
52 curve with mesh electrodes 13a and 13b
56 focusing lens electrode
57 mesh electrode
58 energy filter
59 secondary electrons
60 backscattered electrons
61 divided focusing lens electrode

The invention claimed is:

1. A charged particle beam apparatus, comprising:
a charged particle beam source configured to irradiate a sample with a primary particle beam;
a scanning deflector configured to scan and deflect the primary particle beam to a desired position of the sample; and
a detector configured to detect secondary particles emitted from the desired position;

wherein the charged particle beam apparatus further comprises:
a focusing lens electrode arranged coaxially with the primary particle beam and configured to generate a focusing electric field that is an electric field that focuses a trajectory of the secondary particles; and
a mesh electrode configured to reduce leakage of the focusing electric field on a trajectory of the primary particle beam.

2. The charged particle beam apparatus according to claim 1, wherein
the focusing lens electrode and the mesh electrode are arranged between the scanning deflector and the detector.

3. The charged particle beam apparatus according to claim 2, wherein
the mesh electrode is arranged at least one of between the focusing lens electrode and the detector, and between the focusing lens electrode and the scanning deflector.

4. The charged particle beam apparatus according to claim 3, wherein
the mesh electrode has a curved surface shape.

5. The charged particle beam apparatus according to claim 1, wherein
the focusing lens electrode and the mesh electrode are arranged between the scanning deflector and the sample.

6. The charged particle beam apparatus according to claim 5, wherein
the mesh electrode has a cylindrical shape or a truncated cone shape that forms a hole through which the primary particle beam passes.

7. The charged particle beam apparatus according to claim 6, wherein
the mesh electrode includes a surface arranged between the focusing lens electrode and the sample, and a surface arranged between the focusing lens electrode and the scanning deflector.

8. The charged particle beam apparatus according to claim 5, wherein
the focusing lens electrode and the mesh electrode are further arranged between the scanning deflector and the detector.

9. The charged particle beam apparatus according to claim 1, wherein
the focusing lens electrode has a cylindrical shape.

10. The charged particle beam apparatus according to claim 9, wherein
the focusing lens electrode is divided into a plurality along a circumferential direction.

11. The charged particle beam apparatus according to claim 1, wherein
the focusing lens electrode and the mesh electrode are electrically insulated from each other, and a voltage is independently applied to each of the focusing lens electrode and the mesh electrode.

12. The charged particle beam apparatus according to claim 1, wherein
the detector includes an upper detector that detects secondary particles passing through a hole of a diaphragm, and a lower detector that detects secondary particles colliding with the diaphragm, and
the charged particle beam apparatus further comprises a display device on which a GUI including an adjustment unit that adjusts an amount of the secondary particles detected by the upper detector and a display unit that displays an image formed based on detection by the upper detector and the lower detector is displayed.

* * * * *